United States Patent [19]

Hollyday

[11] 3,991,347
[45] Nov. 9, 1976

[54] PLATED-THROUGH HOLE SOLDERING TO FILTER BODY

[75] Inventor: Robert David Hollyday, Hershey, Pa.

[73] Assignee: AMP Incorporated, Harrisburg, Pa.

[22] Filed: Jan. 31, 1975

[21] Appl. No.: 545,939

[52] U.S. Cl. .......................... 317/101 CC; 29/626; 174/68.5
[51] Int. Cl.² ........................................ H05K 1/04
[58] Field of Search...... 317/101 R, 101 C, 101 CC, 317/100; 29/625, 626; 174/68.5

[56] References Cited
UNITED STATES PATENTS

| | | | |
|---|---|---|---|
| 2,700,150 | 1/1955 | Wales, Jr. | 29/626 |
| 2,902,629 | 9/1959 | Little et al. | 174/685 |
| 2,981,868 | 4/1961 | Severson | 317/101 C X |
| 3,061,760 | 10/1962 | Ezzo | 317/101 B |
| 3,141,998 | 7/1964 | Silkman | 317/100 |
| 3,290,761 | 12/1966 | Ho | 317/101 CC |
| 3,531,579 | 9/1970 | Katz | 29/625 |
| 3,626,081 | 12/1971 | Little | 317/101 CC |

Primary Examiner—David Smith, Jr.
Attorney, Agent, or Firm—Gerald K. Kita

[57] ABSTRACT

A method of one step soldering of the outer diameter of a filter sleeve to a printed circuit board while soldering the leads thereto simultaneously as well as the completed filter assembly. The method comprises provided a printed circuit board having an electrically conductive coating on at least the upper surface with a portion of the conductor removed in the regions where leads from the filter to be positioned on the top surface of the printed circuit board are to extend through the printed circuit board for soldering. The printed circuit board includes apertures extending entirely therethrough, not only for the leads from the components positioned on the surface thereof, but also beneath filter sleeves positioned on the printed circuit board. The apertures in the printed circuit board are preferably coated with an electrically conductive material to provide better adherence for the solder during the soldering operation. In the event a conductive ground plane is to be utilized on the upper and lower surfaces of the printed circuit board, it is essential that the apertures beneath the filter sleeves be plated through.

2 Claims, 5 Drawing Figures

PLATED-THROUGH HOLE SOLDERING TO FILTER BODY

This invention relates to a method of soldering the outer surface of a filter sleeve to the ground plane on a printed circuit board while simultaneously soldering the leads to appropriate conductive paths on the printed circuit board in a one step operation and to the completed device.

In prior art assemblies wherein filters of the sleeve type have been mounted on printed circuit boards, it has been necessary to position such filters on the printed circuit board either by manual means or by use of automated equipment with subsequent wave soldering or manual soldering of the leads to the appropriate paths of the printed circuit board. However, since the outer surface of such filter sleeves must be electrically connected to the ground plane on the printed circuit board, it has been necessary to manually solder each such filter sleeve outer surface to the ground plane of the printed circuit board. This procedure is not only costly because it requires individual soldering of each filter sleeve to the ground plane, but it also requires that the large amounts of heat necessary to melt the solder be applied in close proximity to the filter sleeve. As is well known in the art, excessive heat tends to damage electronic components and render them unfit for their intended purpose. This can also be the case with filter sleeves. It is therefore desirable that a minimal amount of heat be located in the vicinity of the filter sleeve.

In accordance with the present invention, the above problems of prior art securing of filter assemblies onto printed circuit boards is eliminated. Briefly, the above is accomplished by mounting the filter assemblies onto the printed circuit boards in standard manner while also providing apertures through the printed circuit board which terminate at the outer surface of the filter sleeves. These apertures are preferably plated through to provide improved flow through of solder and adherence qualities to subsequent soldering operations. The printed circuit board with filter assemblies and other components, if desired, mounted thereon is then passed through a wave soldering device wherein the component leads, including the filter leads, and the outer surface of the filter sleeve are properly soldered in place. In this manner, the soldering of the components to the printed circuit board as well as the filter sleeves to the ground plane are performed in a single soldering operation. Also, the excessive heat provided by the use of soldering equipment of the prior art is eliminated since no soldering equipment must be positioned proximite to the filter sleeve.

It is therefore an object of this invention to provide a method of soldering filter assemblies onto a printed circuit board utilizing a one step soldering operation.

It is a further object of this invention to provide a method for soldering filter sleeve assemblies onto a printed circuit board wherein solder passes through apertures in the printed circuit board terminating at the filter sleeve outer surface.

It is a yet further object of this invention to provide a method of soldering filter sleeve assemblies onto a printed circuit board without the requirement of placing a heat source proximite to the filter sleeve having a higher temperature than the melted solder.

The above objects and still further objects of the invention will immediately become apparent to those skilled in the art after consideration of the following preferred embodiment thereof, which is provided by way of example and not by way of limitation, wherein.

Figure 1:
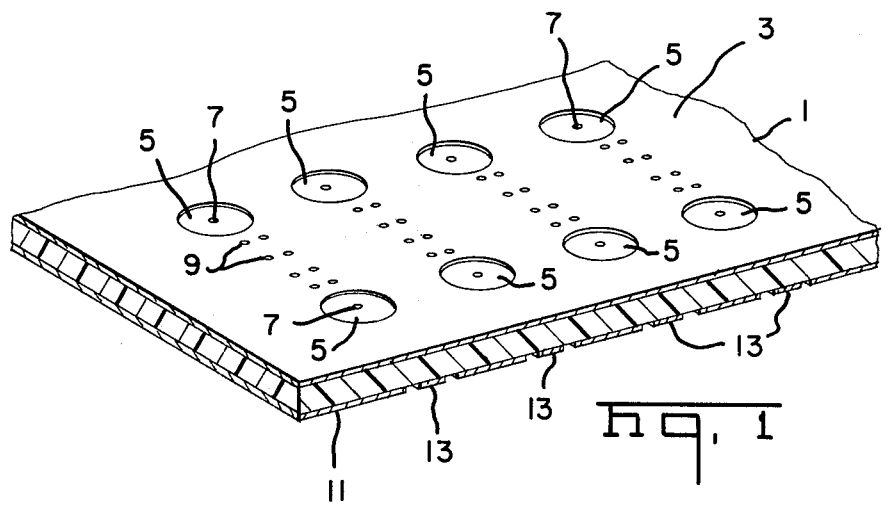
FIG. 1 is a top view of a printed circuit board for use in accordance with the method of the present invention.
Figure 2:
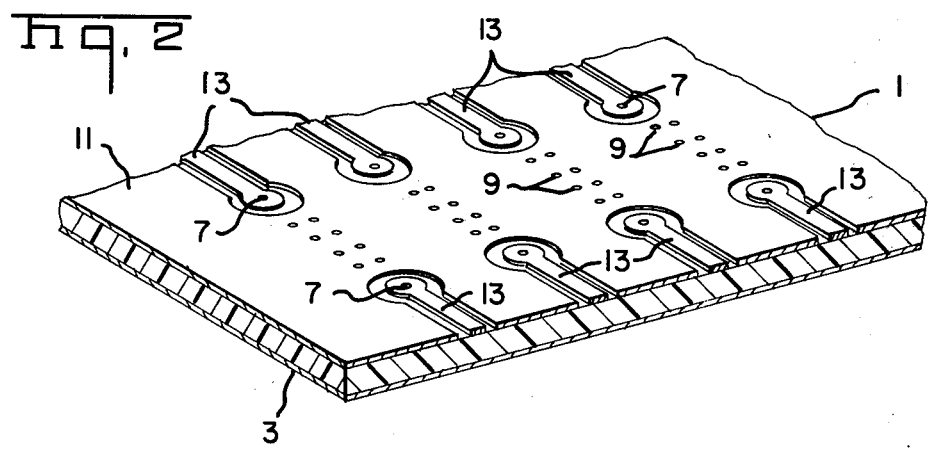
FIG. 2 is a bottom view of a printed circuit board for use in accordance with the method of the present invention.

Referring now to FIG. 1, there is shown the top view of the printed circuit board 1. The top surface of the printed circuit board includes an electrically conducting region 3 which can be formed of any of the well known electrically conductive elements which are deposited on printed circuit boards, such as copper or the like. The conductor material 3 covers the entire upper surface except for the regions 5 from which the conductor material has been removed. Apertures 7 extend through the printed circuit board 1 at substantially the center region of the acreas 5 from which the conductor material 3 has been removed. The apertures 7 are designed for receipt of the leads from filter sleeve assemblies as will be discussed hereinbelow. Further groups of apertures 9 are positioned between pairs of apertures 7, these apertures 9 extending entirely through the printed circuit board 1 and being designed for the low of solder therethrough as will be explained in detail hereinbelow. The underside of the printed circuit board 1, as shown in FIG. 2, includes the same apertures 9 and 7, these being the extensions of the apertures to the bottom surface of the printed circuit board. The printed circuit board can also have conductive material 11 thereon on the bottom surface, it being desirable but optional. In the event that the conductive material 11 is utilized, it is also desirable that the conductive material 3 and 11 be electrically coupled together by plating through the apertures 9. Electrically conductive paths 13, electrically insulated from the conductive region 11 are provided for connection to the leads from the filter assemblies after soldering as will be explained in more details hereinbelow.

Figure 3:
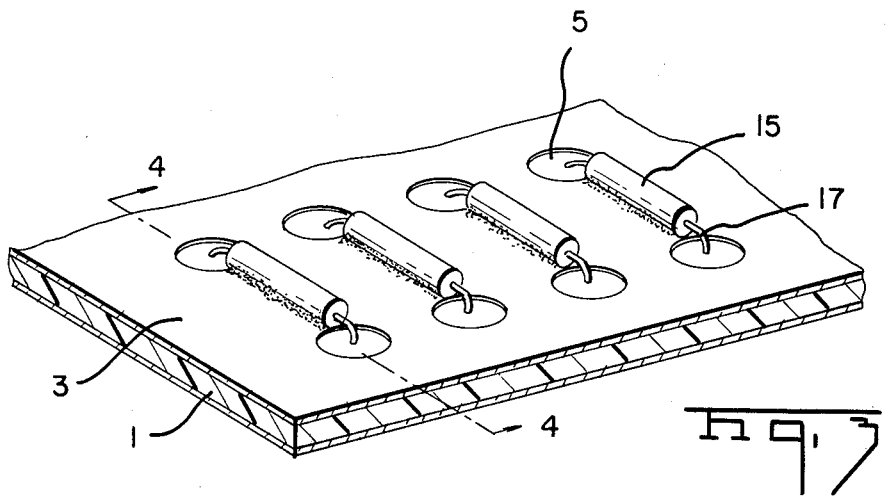
FIG. 3 is a view in elevation of the printed circuit board of FIGS. 1 and 2 with filter assemblies mounted thereon prior to soldering.
Figure 4:
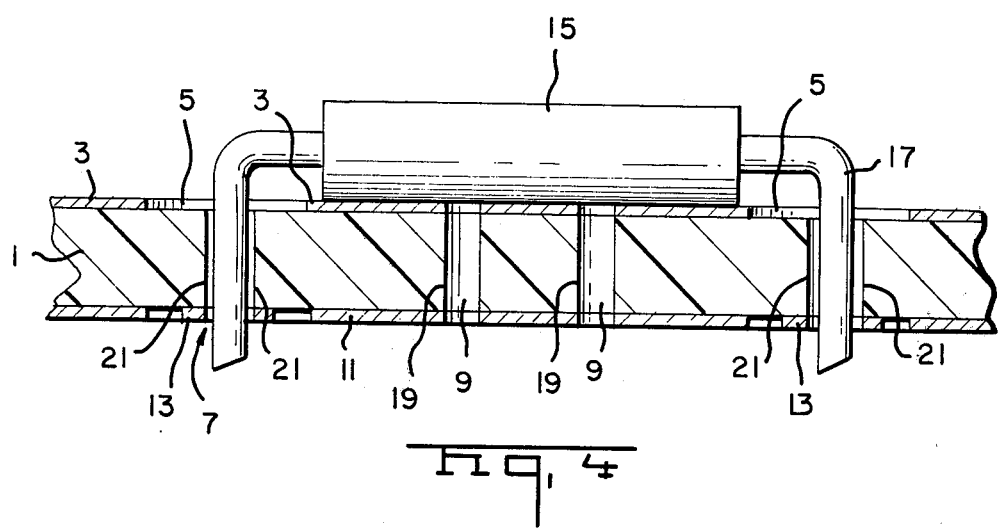
FIG. 4 is a view taken along the line 4-4 of FIG. 3.

Referring now to FIG. 3 there is shown the printed circuit board 1 having filter sleeves 15 positioned thereon with the leads 17 passing through the apertures 7, the filter sleeves 15 being positioned over the apertures 9 as best shown in FIG. 4. The filter assemblies can be positioned on the printed circuit 1 after bending of the leads 17 by means of standard machinery which is well known in the art. The conductive layer 3 forms a ground plane for the filter sleeve 15 and, if there is a second ground plane 11 it will be connected to the ground plane 3 by means of a conductive plating formed on the walls of the apertures 9 and extending from the conductive layer 3 to the conductive layer 11. It is also desirable that an electrically conductive layer be provided in the apertures 7, this being shown as 21 to provide better adherance of the solder therein and to the leads 17 of the filter.

Figure 5:
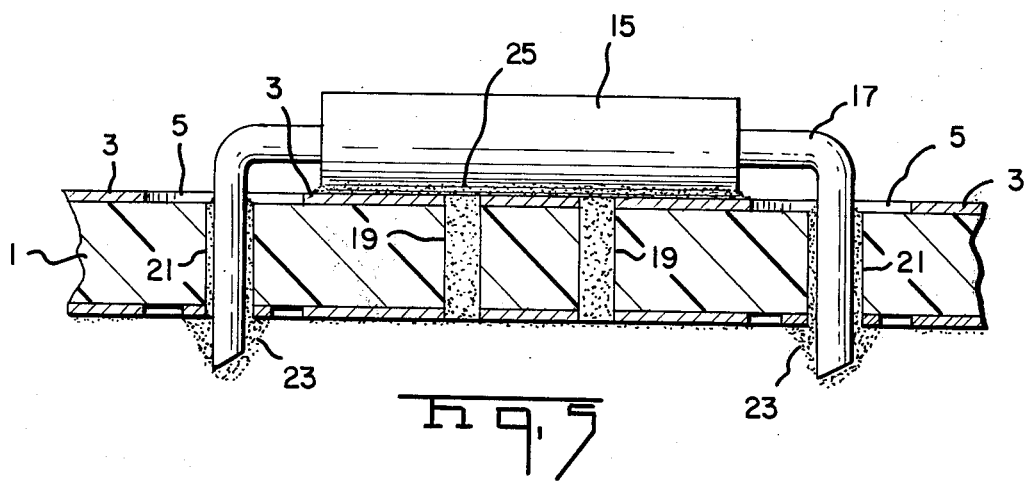
FIG. 5 is a view the same as FIG. 4 after the soldering operation has been completed.

Referring now to FIG. 5, there is shown a portion of a printed circuit board with a filter sleeve 15 mounted thereon as in FIG. 4 but after the soldering operation has taken place. It can be seen that solder 23 has soldered the leads 17 to the conductive path portion 13 as best shown in FIG. 2, the solder 23 extending inwardly into the aperture region 7 to provide good adherance of the solder and good electrical connection. In addition, solder has travelled upward through the apertures 9 to the underside of the filter sleeve 15, thereby providing good electrical coupling between the outer portion of the filter sleeve and the conductive layer 3. Since the solder 25 extends not only along the filter sleeve 15 but also through the aperture 9, filling the apertures 9, good electrical connection is made between upper and lower ground planes 3 and 11 as shown.

It can be seen that there has been provided a method of securing fragile, heat sensitive filter assemblies to a printed board by a one step soldering operation, thereby eliminating the necessity of manual soldering operations and minimizing the quantity of heat proximite to the filter sleeve during soldering.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. In the combination of a printed circuit board having a top surface provided with an electrically conductive area, an electrical component having a solderable surface engaged against said conductive area, and depending leads of said component pluggably received in metal lined apertures through said printed circuit board together with solder joining said leads in said metal lined apertures, the improvement comprising:
   additional metal lined apertures devoid of electrical leads therein extending through said printed circuit board and intercepting both said conductive area and said electrical component and providing pathways for solder filling said additional apertures and electrically joining said component solderable surface to said conductive area.

2. In the method of soldering an electrical component in a printed circuit board by wicking solder upwardly through metal lined apertures of the printed circuit board and also along electrical leads depending from the component and received in said metal lined apertures, the improvement comprising the steps of:
   engaging a conductive surface of said component on a conductive area on a top surface of the board,
   providing at least one additional aperture devoid of any electrical lead therein through said board intercepting both said conductive area and said solderable surface of said component, and
   wicking solder upwardly through each said additional aperture to solder join said component solderable surface and said conductive area.

* * * * *